United States Patent
Hwang

(10) Patent No.: US 7,727,414 B2
(45) Date of Patent: Jun. 1, 2010

(54) HEAT TRANSFER FLUIDS WITH CARBON NANOCAPSULES

(75) Inventor: Gan-Lin Hwang, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 57 days.

(21) Appl. No.: 11/473,246

(22) Filed: Jun. 23, 2006

(65) Prior Publication Data

US 2010/0108937 A1    May 6, 2010

(30) Foreign Application Priority Data

Nov. 30, 2005  (TW) ............................... 94142041 A

(51) Int. Cl.
*C09K 5/00* (2006.01)
(52) U.S. Cl. ............................. 252/71; 252/76; 252/69; 165/80.4; 165/104.26; 423/447.1; 423/447.2; 428/408; 508/113
(58) Field of Classification Search ................ 252/511, 252/71, 76, 79; 165/80.4, 104.26; 423/447.1, 423/447.2; 508/113; 428/408; 65/374.11; 75/347; 205/316; 361/704
See application file for complete search history.

(56) References Cited

U.S. PATENT DOCUMENTS

| | | | |
|---|---|---|---|
| 6,695,974 B2 | 2/2004 | Withers et al. | |
| 6,872,236 B1 * | 3/2005 | Hwang | ........................ 75/347 |
| 7,213,637 B2 * | 5/2007 | Lin et al. | ............... 165/104.26 |
| 7,396,521 B2 * | 7/2008 | Hwang | .................... 423/447.1 |
| 2002/0100578 A1 * | 8/2002 | Withers et al. | ............. 165/80.4 |
| 2004/0125565 A1 * | 7/2004 | Chen et al. | ................... 361/704 |
| 2004/0126303 A1 * | 7/2004 | Hwang | ..................... 423/447.2 |
| 2004/0209782 A1 * | 10/2004 | Zhang et al. | ................ 508/113 |
| 2004/0238799 A1 * | 12/2004 | Hwang et al. | ................ 252/511 |
| 2005/0016863 A1 * | 1/2005 | Hwang et al. | ............... 205/316 |
| 2005/0092467 A1 | 5/2005 | Lin et al. | |
| 2005/0244326 A1 * | 11/2005 | Colbert et al. | ........... 423/447.1 |
| 2005/0244644 A1 * | 11/2005 | Hampden-Smith et al. | .. 428/408 |
| 2006/0162388 A1 * | 7/2006 | Leu | .......................... 65/374.11 |

FOREIGN PATENT DOCUMENTS

| | | | |
|---|---|---|---|
| DE | 4114536 A1 | | 11/1991 |
| JP | 08-133716 | * | 5/1996 |
| JP | 2004-331737 | * | 11/2004 |
| TW | 246562 Y | | 10/2004 |

OTHER PUBLICATIONS

Manaa, Electronic structure of solid C48N12 aza-fullerene, Solid State Communications 2004; 129:379-383.*

* cited by examiner

*Primary Examiner*—Mark Kopec
*Assistant Examiner*—Khanh Tuan Nguyen
(74) *Attorney, Agent, or Firm*—Birch, Stewart, Kolasch & Birch, LLP

(57) ABSTRACT

A heat transfer fluid with carbon nanocapsules. The heat transfer fluid comprises a fluid and a plurality of carbon nanocapsules, uniformly dispersed in the fluid, in an amount of 0.05 to 10 parts by weight, based on 100 parts by weight of the heat transfer fluid. Particularly, the carbon nanocapsules are modified to bond with at least one kind of functional group, improving dispersiblity in the fluid. Thus, since the carbon nanocapsules are apt to disperse in fluid and have superior thermal conductivity, the heat conduction capability of the heat transfer fluid therewith is enhanced.

8 Claims, 3 Drawing Sheets

HEAT TRANSFER FLUIDS WITH CARBON NANOCAPSULES

BACKGROUND OF THE INVENTION

1. Field of the Invention

The invention relates to a heat transfer fluids, and in particular heat transfer fluids with carbon nanocapsules.

2. Description of the Related Art

Electric power consumption results in generation of heat during the operation of devices such as computers, electronic equipment, or communication apparatus. Since device life is reduced with high operating temperature thereof, the operating temperature has to be maintained within a specific range.

Efficiency and convenience are important in electronic products preferably featuring low profile, multiple functions and highly efficient operation. In respect of semiconductor industry and integrated circuit (IC) design, although it has successfully attained to important improvements such as profile miniaturization, high integration and multi-functions for electronic elements, however, a reliability issue is generated due to heat production during operation of the electronic elements.

A conventional cooling device having a heat sink and a small fan mounted in association with the electric device, however, cannot meet the demand for efficiently dissipated heat outside the electric device. Moreover, noise is generated during the operation of the fan.

Recently, with the development and wide application of electronic products, such as mobile phones, PDA, and notebook computers, there has been increasing demand for electric devices which have longer run-time and occupy less space. Accordingly, excess heat is accumulated and concentrated, presenting a challenge for heat dissipating technology.

Higher efficiency can be provided by fluid cooling. In a conventional fluid cooling system for a notebook computer, pure water serves as a heat transfer fluid. However, for many applications, the thermal conductivity of pure water is too low, with rate of heat transmission accordingly slow, making the operating efficiency of the heat pipe is unsatisfactory.

Therefore, it is advantageous to develop a heat transfer fluid with high thermal conductivity and suitable mobility for a electric device such as a notebook computer.

BRIEF SUMMARY OF THE INVENTION

The invention provides a heat transfer fluid with carbon nanocapsules serving as cooling liquid for a heat dissipation system such as a Micro-Fluid Heat Exchanger. The heat transfer fluid comprises a fluid and a plurality of carbon nanocapsules, uniformly dispersed in the fluid, in an amount of 0.05 to 10 parts by weight, more preferably 0.1 to 4 parts by weight, based on 100 parts by weight of the heat transfer fluid.

Since the carbon nanocapsules disperse in fluid and provide superior thermal conductivity, the heat conduction of the fluid is enhanced.

Particularly, the carbon nanocapsules are modified to bond with at least one kind of functional group, improving dispersiblity in the fluid.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The heat transfer fluid comprises a fluid and a plurality of carbon nanocapsules uniformly dispersed therein. The fluid can be water or organic solvent (such as alcohol or engine oil). In embodiments of the present invention, the fluid is water, methanol, ethanol, n-propanol, iso-propanol, n-butanol, iso-butanol, t-butanol, t-pentanol, ethylene glycol, ethylene glycol monomethyl ether, ethylene glycol monoethyl ether, propylene glycol monoethyl ether, styrene, ethyl acetate, toluene, xylene, methyl ethyl ketone, acetone, engine oil, or combinations thereof.

In the invention, carbon nanocapsules are polyhedral carbon clusters with completed and closed polyhedral graphite layers. The polyhedral morphology of carbon nanocapsules exhibits flat graphitic layers except at the corners where the pentagons are located with all atoms on the nanocapsule $sp^2$ hybrid orbital. The carbon nanocapsule is brought about by well-developed graphitic structure, with thermal and electric conductance, high mechanical strength, chemical stability, large superficial content, firm structure and electromagnetic interference shielding. The graphite layers of nanocapsules comprise carbon atoms. Furthermore, the graphite layers of nanocapsules can be hetero-atom doped, increasing dispersibility in solvent, bonding ability, and conductibility thereof.

Figure 2:
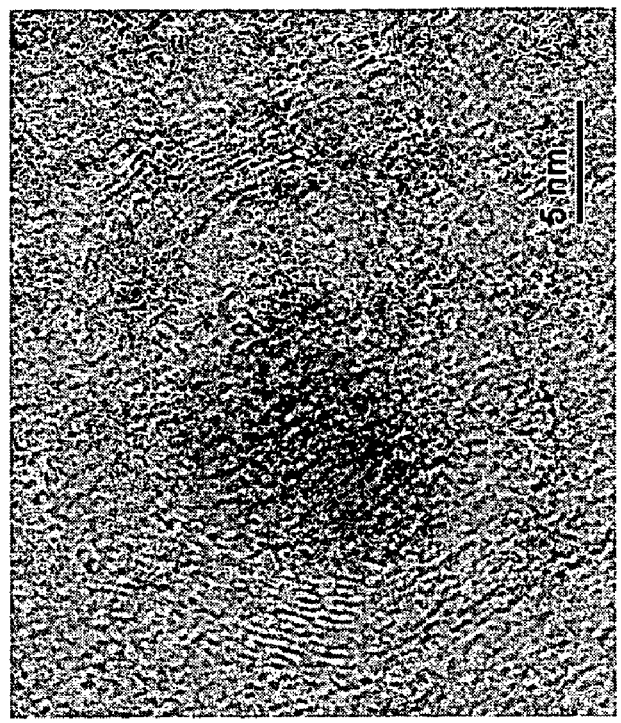
FIG. 2 is a high resolution TEM (transmission electron microscopy) photograph of terbium-filled carbon nanocapsules of an embodiment of the present invention.
Figure 1:
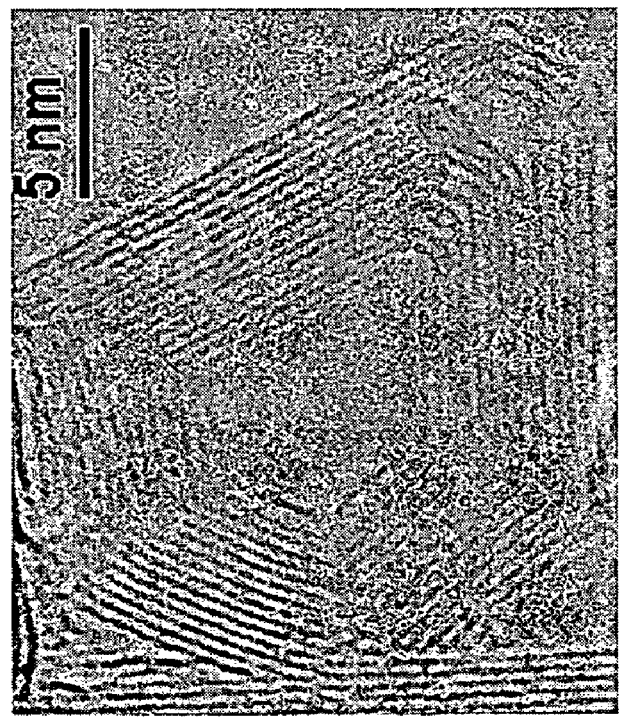
FIG. 1 is a high resolution TEM (transmission electron microscopy) photograph of hollow carbon nanocapsules of an embodiment of the invention.

The carbon nanocapsule can be hollow and comprise a graphite layer. Furthermore, the carbon nanocapsule can comprise two graphite layers and be filled with 0.1~80 wt % fillers, such as metal, metal oxide, metal carbides, metal sulfide, metal nitride, metal borate, or alloy, based on the weight of the nanocapsule. Suitable metals or metallines can comprise, without being limited to, Sc, V, Cr, Fe, Co, Ni, Cu, Y, Zr, Mo, Ru, Rh, Pd, La, Ce, Pr, Nd, Gd, Tb, Dy, Ho, Er, Tm, Lu, Ta, Os, Ir, Pt, Au, Th, U, or combinations thereof. The heat transfer fluid with carbon nanocapsule filled with magnetic filters exhibits magnetic activity and can be used in a heat pipe with applied magnetic or electric field. FIG. 1 shows a high resolution TEM (transmission electron microscopy) photograph of hollow carbon nanocapsules. FIG. 2 shows a high resolution TEM (transmission electron microscopy) photograph of terbium-filled carbon nanocapsules.

Since the carbon nanocapsules have superior thermal conductivity (more than 1600 W/mK), large surface area, and lightweight characteristics, the heat transfer fluid is more efficient. Further, since the carbon nanocapsules have diameters of less than 100 nm and superior thermal stability, the heat transfer fluid is suitable for heat dissipation systems employing a Micro-Fluid Heat Exchanger with a diameter less than 10 μm.

In order to improve the dispersiblity of carbon nanocapsules in the fluid, the carbon nanocapsules are modified to bond with at least one kind of functional group. The functional group can be hydroxyl group, carbonyl group, amino group, carboxyl group, sulfhydryl group, nitro group, alkyloxy group, or radical group thereof, and reacts with the unsaturated double bond of the carbon nanocapsules. Thus, the carbon nanocapsules can uniformly disperse into the fluid-without addition of surfactant. For example, the functional group bonded on the carbon nanocapsules can be Y1,Y2-amino, (Y1,Y2-alkyl)amino, Y1,Y2-ethylenediamino, (dihydroxymethyl)alkylamino, (X1,X3-aryl)amino, or X1,X3-aryloxy; each E2, independently, is Y1,Y2-alkoxy, (Y1,Y2-amino)alkoxy, (Y1,Y2,Y3-aryl)oxy, (dihydroxyalkyl)aryloxy, (Y1,Y2,Y3-alkyl)amino, (Y1,Y2,Y3-aryl) amino, or dihydroxyalkylamino; each E3, independently, is Y1,Y2,Y3-alkoxy, (trihydroxyalkyl)alkoxy, (trihydroxyalkyl)alkylamino, (dicarboxyalkyl)amino, (Y1,Y2,Y3-alkyl) thio, (X1,X2-aryl)thio, (Y1,Y2-alkyl)thio, (dihydroxyalkyl) thio, Y1,Y2-dioxoalkyl; each E4, independently, is ((glycosidyl)oxoheteroaryl)amino, ((glycosidyl)oxoaryl) amino, (X1,X2,X3-heteroaryl)amino, (X1-diarylketone) amino, (X,X1-oxoaryl)amino, (X,X1-dioxoaryl)amino, (Y1-alkyl, Y2-alkyldioxoheteroaryl)amino, (Y1-alkyl, Y2-alkyldioxoaryl)amino, (di(Y1,Y2-methyl)dioxoheteroaryl)amino, (di(Y1,Y2-methyl)dioxoaryl)amino, ((glycosidyl)heteroaryl)amino, ((glycosidyl)aryl)amino, ((carboxylacetylalkyl)oxoheteroaryl)amino, ((carboxylacetylalkyl)oxoaryl)amino, ((isopropylaminohydroxyalkoxy)aryl)amino, or (X1,X2,X3-alkylaryl)amino; each E5, independently, is (X1,X2,X3-heteroaryl)oxy, (isopropylaminohydroxyalkyl)aryloxy, (X1,X2,X3-oxoheteroaryl)oxy, (X1,X2,X3-oxoaryl)oxy, (X1,Y1-oxoheteroaryl)oxy, (X1-diarylketone)oxy, (X,X1-oxoaryl)oxy, (X1, X2-dioxoaryl)oxy, (Y1,Y2,diaminodihydroxy)alkyl, (X1, X2-heteroaryl)thio, ((tricarboxylalkyl)ethylenediamino) alkoxy, (X1,X2-oxoaryl)thio, (X1,X2-dioxoaryl)thio, (glycosidylheteroaryl)thio, (glycosidylaryl)thio, Y1-alkyl (thiocarbonyl)thio, Y1,Y2-alkyl(thiocarbonyl)thio, Y1,Y2, Y3-alkyl(thiocarbonyl)thio, (Y1,Y2-aminothiocarbonyl) thio, (pyranosyl)thio, cysteinyl, tyrosinyl, (phenylalainyl) amino, (dicarboxyalkyl)thio, (aminoaryl)1-20 amino, or (pyranosyl)amino;

each X, independently, is halide; each of X1 and X2, independently, is —H, —Y1, —O—Y1, —S—Y1, —NH—Y1, —O—CO—Y1, —CO—NH—Y1—, —CO—NY1Y2, —SO2—Y1, —CHY1Y2, or —NY1Y2; each X3, independently, is —Y1, —O—Y1, —S—Y1, —NH—Y1, —O—CO—Y1, —CO—NH—Y1, —CO—NY1Y2, —SO2—Y1, —CHY1Y2 or —NY1Y2;

each of Y1, Y2 and Y3, independently, is —B—Z;

each B, independently, is —Ra—O—[Si(CH3)-2-O—]1-100, C1-2000 alkyl, C6-40 aryl, C7-60 alkylaryl, C7-60 arylalkyl, (C1-30 alkyl ether)1-100, (C6-40 aryl ether)1-100, (C7-60 alkylaryl ether)1-100, (C7-60 arylalkyl ether)1-100, (C1-30 alkyl thioether)1-100(C6-40 aryl thioether)1-100, (C7-60 alkylaryl thioether)1-100, (C7-60 arylalkyl thioether) 1-100, (C2-50 alkyl ester)1-100, (C7-60 aryl ester)1-100, (C8-70 alkylaryl ester)1-100, (C8-70 arylalkyl ester)1-100, —R—CO—O—(C1-30 alkyl ether)1-100, —R—CO—O—(C6-40 aryl ether)1-100, alkylaryl ether)1-100, —R—CO—O—(C7-60 arylalkyl ether)1-100, (C4-50 alkyl urethane)1-100 (C14-60 aryl urethane)1-100, (C10-80 alkylaryl urethane)1-100 (C10-80 arylalkyl urethane)1-100, (C5-50 alkyl urea)1-100, (C14-60 aryl urea)1-100 (C10-80 alkylaryl urea)1-100, (C10-80 arylalkyl urea)1-100, (C2-50 alkyl amide)1-100, (C7-60 aryl amide)1-100, (C8-70 alkylaryl amide)1-100 (C8-70 arylalkyl amide)1-100, (C3-30 alkyl anhydride)1-100, (C8-50 aryl anhydride)1-100, (C9-60 alkylaryl anhydride)1-100, (C9-60 arylalkyl anhydride)1-100, (C2-30 alkyl carbonate)1-100, (C7-50 aryl carbonate)1-100, (C8-60 alkylaryl carbonate)1-100, (C8-60 arylalkyl carbonate)1-100, —R1—O—CO—NH—(R2 or Ar—R2—Ar)—NH—CO—O—(C1-30 alkyl ether, C6-40 aryl ether, C7-60 alkylaryl ether, or C7-60 arylalkyl ether)1-100, —R1—O—CO—NH—(R2 or Ar—R2—Ar)—NH—CO—O(C2-50 alkyl ester, C7-60 aryl ester, C8-70 alkylaryl ester, or C8-70 arylalkyl ester)1-100, —R1—C—CO—NH—(R2 or Ar—R2—Ar)—NH—CO—O—(C1-30 alkyl ether, C6-40 aryl ether, C7-60 alkylaryl ether, or C7-60 arylalkyl ether)1-100, —CO—NH—(R2 or Ar—R2—Ar)—NH—CO—O—, —R1—O—CO—NH—(R2 or Ar—R2—Ar)—NH—CO—O—(C2-50 alkyl ester, C7-60 aryl ester; C8-70-alkylaryl ester; or C8-70 arylalkyl ester)1-100, —R3—O—CO—NH—(R2 or Ar—R2—Ar)—NH—CO—O—, —R1—NH—CO—NH—(R2 or Ar—R2—Ar)—NH—O—(C1-30 alkyl ether, C6-40 aryl ether, C7-60 alkylaryl ether, or C7-60 arylalkyl ether)1-100, —R1—NH—CO—NH—(R2 or Ar—R2—Ar)—NH—CO—O—(C2-50 alkyl ester, C7-60 aryl ester, C8-70 alkylaryl ester, or C8-70 arylalkyl ester)1-100, —R1—NH—CO—NH—(R2 or Ar—R2—Ar)—NH—CO—O—(C1-30 alkyl ether, C6-40 aryl ether, C7-60 alkylaryl ether, or C7-60 arylalkyl ether)1-100, —CO—NH—(R2 or Ar—R2—Ar)—NH—CO—O—, —R1—NH—CO—NH—(R2 or Ar—R2—Ar)—NH—CO—O—(C2-50 alkyl ester, C7-60 aryl ester, C8-70 alkylaryl ester, or C8-70 arylalkyl ester)1-100, —R3—O—CO—NH—(R2 or Ar—R2—Ar)—NH—CO—O—, —R1—O—CO—NH—(R2 or Ar—R2—Ar)—NH—CO—NH—(C2-50 alkyl amide, C7-60 aryl amide, C8-70 alkylaryl amide, or C8-70 arylalkyl amide)1-100, or —R1—NH—CO—NH—(R2 or Ar—R2—Ar)NH—CO—NH—(C2-50 alkyl amide, C7-60 aryl amide, C8-70 alkylaryl amide, or C8-70 arylalkyl amide) 1-100;

each Z, independently, is —C—D—, wherein each C, independently, is —R—, —R—Ar—, —Ar—R—, or —Ar—; and each D, independently, is —OH, —SH, —NH2, —NHOH, —SO3H, —OSO3H, —COOH, —CONH2, —CO—NH—NH2, —CH(NH2)-COOH, —P(OH)3, —PO (OH)2, —O—PO(OH)2, —O—PO(OH)—O—PO(OH)2, —O—PO(O—)—O—CH2CH2NH3+, -glycoside, —OCH3, —O—CH2—(CHOH)4—CH24—CH, —O—CH2—(CHOH)2—CHOH, —C6H3(OH)2, —NH3+, —N+HRbRc, or N+HRbRcRd; wherein each of R, R1, R2, R3, Ra, Rb, Rc, and Rd independently, is C1-30 alkyl, each Ar, independently, is aryl.

Preparation of Water-Soluble Carbon Nanocapsules

A reaction flask was charged with hollow carbon nanocapsules (2.0 g) dissolved in sulfuric acid/nitric acid (weight ratio=1:1). The mixture was stirred by an untrasonic cleaner for 10 mins, and heated to about 140° C. and refluxed for 3 hours. Afterwards, the mixture was centrifuged to separate the carbon nanocapsules from the strong acid, rinsing the carbon nanocapsules thoroughly, followed by several centrifuges, until the pH value of carbon nanocapsules approached 7. The carbon nanocapsules obtained were black with —COOH groups bonded thereon.

Figure 3:
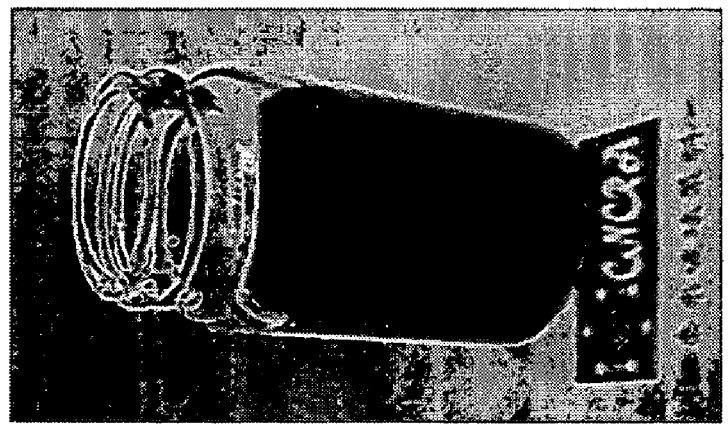
FIG. 3 is a photograph of heat transfer fluid of an embodiment of the invention.

Preparation of Heat Transfer Fluid with Water-Soluble Carbon Nanocapsules 0.5 g and 2 g carbon nanocapsules with —COOH groups bonded thereon were respectively added into 100 g of pure water, and 0.5 wt % and 2 wt % heat transfer fluids were obtained as shown in FIG. 3.

Properties of Heat Transfer Fluid with Water-Soluble Carbon Nanocapsules

Figure 4:
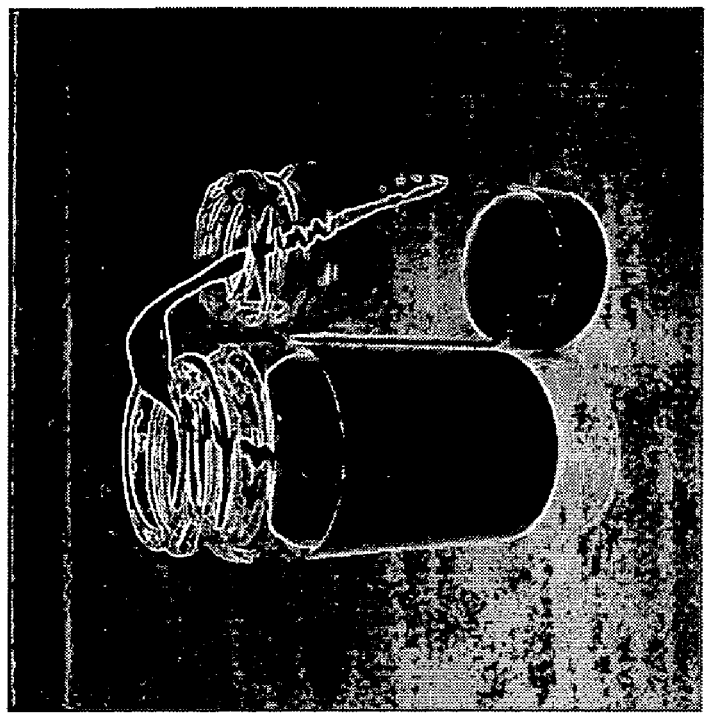
FIG. 4 is a photograph illustrating that the carbon nanocapsules with functional groups to another bottle by capillarity.
Figure 5:
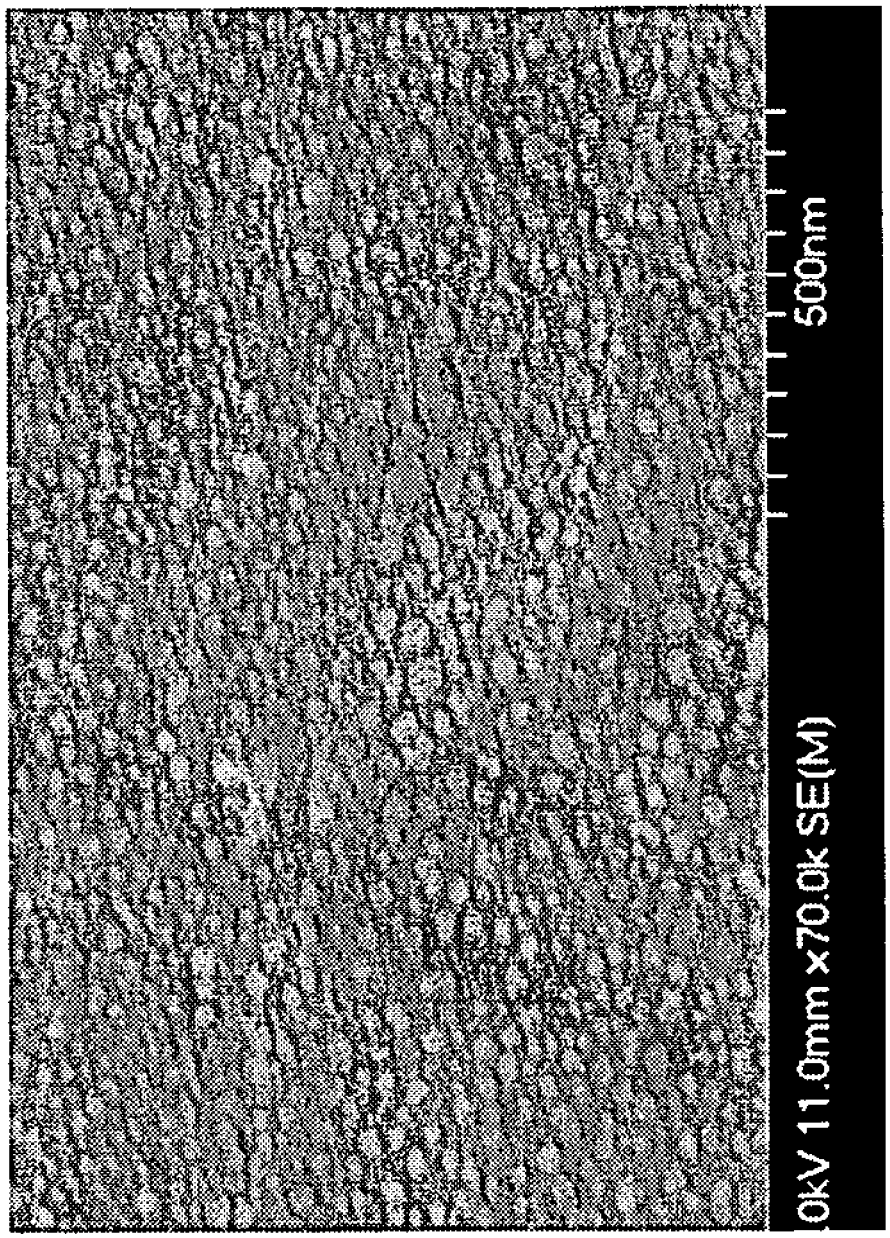
FIG. 5 is a SEM (scanning electron microscope) photograph of carbon nanocapsule with functional groups in an embodiment of the invention.

Referring to FIG. 4, the heat transfer fluid having carbon nanocapsules with —COOH groups bonded thereon moved to another bottle by capillarity due to the superior solubility of the water-soluble carbon nanocapsules. Further, 0.1 ml of the heat transfer fluid was coated and dried on a substrate, and observed with scanning electron microscope. Referring to FIG. 5, the carbon nanocapsules were uniformly distributed on the substrate.

The measured results of properties for the aforementioned 0.5 wt % and 2 wt % heat transfer fluids are shown in Table 1.

TABLE 1

| | Pure-water | 0.5 wt % heat transfer fluid | 2 wt % heat transfer fluid |
| --- | --- | --- | --- |
| Electric conductivity (mV) | 2.1 | 76.4 | 270.5 |
| Thermal conductivity (W/mk) | 0.64 | 2.92 | 8.12 |

As described in Table 1, since the thermal conductivity of the heat transfer fluid are 4.5-12 times that of pure water, the addition of carbon nanocapsules enhances the heat dissipation capability of water.

Conventially, carbon nanotubes has been added into a heat transfer fluid. Due to the length of the carbon nanotubes, the heat transfer fluid has inferior mobility and is apt to block the heat pipe. According to the invention, since the diameter of the carbon nanocapsules is between 1 to 100 nm and most between 30 to 40 nm, the heat transfer fluid has superior mobility used in the heat pipe.

Furthermore, metal compounds, such as copper oxide, gold, or silver particle, are added into heat transfer fluid for the conventional dissipation system. In order to improve the suability between metal compound and fluid, it is necessary to add a surfactant into the heat transfer fluid. The comparison results of the heat transfer fluids between the invention and conventional are shown in Table 2.

TABLE 2

| | Relative thermal conductivity (based on water) | Reference |
| --- | --- | --- |
| 0.5 wt % carbon nanocapsules with —COOH group (in water) | 478% | Embodiment of the invention |
| 1 vol % Al$_2$O$_3$ (in water) | 102% | Lee S et. al (Lee S, Choi SUS, Li S, Eastman J A. 1999. Measuring thermal conductivity of fluids containing oxide nano- |

TABLE 2-continued

| | Relative thermal conductivity (based on water) | Reference |
| --- | --- | --- |
| | | particles. J. Heat Trans. 121:280) |
| 0.4 vol % CuO (in ethylene glycol) | 155% | Eaetman J A et. al (Eastman J A, Choi SUS, Li S, Yu W, Thompson L J. 2001. Anomalously increased effective thermal conductivities of ethylene glycol-based nanofluids containing copper nanoparticles. Appl. Phys. Lett. 78:718-20) |
| 0.011 wt % Au and Ag (in toluene) | 121% | Patel et. al (Patel H E, Das S K, Sundararajan T, Nair A S, George B, Pradeep T. 2003. Thermal conductivities of naked and monolayer protected metal nanoparticle based nanofluids: manifestation of anomalous enhancement and chemical effects. Appl: Phys. Lett. 83:2931-33) |
| 0.16 vol % carbon nanotube (in oil) | 150% | Choi SUS et.al (Choi SUS, Zhang Z G, Yu W, Lockwood F E, Grulke E A. 2001. Anomalous thermal conductivity enhancement in nano-tube suspensions. Appl. Phys. Lett. 79:2252-54) |

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat transfer fluid with carbon nanocapsules, comprising:
   a fluid; and
   a plurality of carbon nanocapsules uniformly dispersed in the fluid,
   wherein the carbon nanocapsules are modified to bond with at least one kind of functional group, improving dispersiblity in the fluid, and
   wherein the carbon nanocapsule is a polyhedral carbon cluster constituting multiple graphite layers having a balls-within-a ball structure, wherein the carbon nanocapsules are present in an amount of 0.05 to 10 parts weight, based on 100 parts by weight of the heat transfer fluid.

2. The heat transfer fluid as claimed in claim 1, wherein the carbon nanocapsule is hollow.

3. The heat transfer fluid as claimed in claim 1, wherein the carbon nanocapsule is a carbon nanocapsule filled with metals, metal oxides, metal carbides, metal sulfide, metal nitride, metal borate or alloys.

4. The heat transfer fluid as claimed in claim 1, wherein the diameter of the carbon nanocapsule is 1-100 nm.

5. The heat transfer fluid as claimed in claim 1, wherein the functional group is hydroxyl group, carbonyl group, amino group, carboxyl group, sulfhydryl group, nitro group, alkyloxy group, or radical group thereof.

6. The heat transfer fluid as claimed in claim 1, wherein the fluid is water, organic solvent or combinations thereof.

7. The heat transfer fluid as claimed in claim 1, wherein the fluid is alcohol.

8. The heat transfer fluid as claimed in claim 1, wherein the fluid is water, methanol, ethanol, n-propanol, iso-propanol, n-butanol, iso-butanol, t-butanol, t-pentanol, ethylene glycol, ethylene glycol monomethyl ether, ethylene glycol monoethyl ether, propylene glycol monoethyl ether, styrene, ethyl acetate, toluene, xylene, methyl ethyl ketone, acetone, engine oil, or combinations thereof.

* * * * *